US010375865B2

(12) United States Patent
Gloster et al.

(10) Patent No.: US 10,375,865 B2
(45) Date of Patent: Aug. 6, 2019

(54) MECHANICALLY ATTACHED EDGE SHIELD

(71) Applicant: Microsoft Technology Licensing, LLC, Redmond, WA (US)

(72) Inventors: Mark Mitchell Gloster, Redmond, WA (US); Whitney Giaimo, Bellevue, WA (US); John Godfrey, Woodinville, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 15/469,135

(22) Filed: Mar. 24, 2017

(65) Prior Publication Data

US 2018/0279515 A1 Sep. 27, 2018

(51) Int. Cl.

| | |
|---|---|
| ***H05K 9/00*** | (2006.01) |
| ***H05K 1/18*** | (2006.01) |
| ***H05K 3/30*** | (2006.01) |

(52) U.S. Cl.
CPC ........... *H05K 9/0032* (2013.01); *H05K 1/181* (2013.01); *H05K 3/303* (2013.01); *H05K 9/0026* (2013.01); *H05K 2201/10227* (2013.01)

(58) Field of Classification Search
CPC .......................................... H05K 9/0007–0039
See application file for complete search history.

(56) References Cited

U.S. PATENT DOCUMENTS

| | | | | |
|---|---|---|---|---|
| 5,043,848 A | | 8/1991 | Rogers et al. | |
| 5,586,011 A | | 12/1996 | Alexander | |
| 5,644,101 A | | 7/1997 | Elliott | |
| 5,847,317 A | | 12/1998 | Phelps | |
| 5,898,344 A | * | 4/1999 | Hayashi ............... | H05K 3/3405 331/67 |
| 6,079,099 A | * | 6/2000 | Uchida ................ | H05K 3/3405 174/382 |
| 6,269,008 B1 | * | 7/2001 | Hsu ...................... | H05K 9/0032 174/353 |
| 7,013,558 B2 | | 3/2006 | Bachman | |
| 2004/0240191 A1 | | 12/2004 | Arnold et al. | |
| 2009/0244876 A1 | * | 10/2009 | Li ........................ | H05K 9/0032 361/818 |

(Continued)

FOREIGN PATENT DOCUMENTS

EP 3060034 A1 8/2016

OTHER PUBLICATIONS

Armstrong, Eur Ing Keith, "Advanced PCB design and layout for EMC. Part 2—Segregation and Interface Suppression", In EMC & Compliance Journal, May 2004, 25 pages.

(Continued)

*Primary Examiner* — Hoa C Nguyen
(74) *Attorney, Agent, or Firm* — Holzer Patel Drennan

(57) ABSTRACT

The edge shields disclosed herein utilize a plated edge surface of a PCB to form one or more sides of an electronic shield to reduce the amount of top surface area of the PCB occupied by the electronic shield. More specifically, an edge shield lid is mechanically attached to the plated edge surface to remove a need for solder overprint at the edge of the PCB. The edge shield lid is soldered, welded, adhered, or mechanically attached to edge walls where there is no available edge surface for attachment.

20 Claims, 6 Drawing Sheets

(56) References Cited

U.S. PATENT DOCUMENTS

| | | | | |
|---|---|---|---|---|
| 2010/0060454 | A1* | 3/2010 | Kazanchian | H05K 1/0218 340/572.1 |
| 2010/0246143 | A1 | 9/2010 | Dinh et al. | |
| 2010/0315799 | A1* | 12/2010 | Suzuki | H01L 23/043 361/818 |
| 2012/0281386 | A1* | 11/2012 | Kim | H05K 9/0028 361/818 |
| 2013/0048369 | A1 | 2/2013 | Malek et al. | |
| 2013/0120957 | A1 | 5/2013 | Werner et al. | |
| 2014/0262473 | A1 | 9/2014 | Robinson et al. | |
| 2014/0313687 | A1 | 10/2014 | Lin et al. | |
| 2015/0282298 | A1 | 10/2015 | Atkinson et al. | |

OTHER PUBLICATIONS

"International Search Report & Written Opinion Issued in PCT Application No. PCT/US2018/023048", dated Jun. 13, 2018, 10 Pages.

* cited by examiner

MECHANICALLY ATTACHED EDGE SHIELD

BACKGROUND

A printed circuit board (PCB) mechanically supports and electrically interconnects an array of electronic components using conductive traces, vias, and other features etched from metallic sheets laminated onto a non-conductive substrate. Typically, the electronic components are soldered to the conductive features of the PCB.

As packaging requirements for PCBs become tighter, particularly for mobile devices where space is at a premium, soldered connections are less desirable as they take significant space of the PCB to yield a sufficiently strong connection. Further, tighter packaging requirements may lead to difficulties shielding sensitive electronic components on the PCB from other nearby electronic components that may generate electronic interference.

One solution is encompassing the sensitive electronic components within one or more shield cans (e.g., a physical enclosure operated as a faraday cage) soldered to the PCB. However, soldered shield cans often require a significant perimeter flange for the soldered connection with the PCB. Some soldered edge shields may omit the perimeter flange at the edge of the PCB and instead utilize a solder overprint deposited on the PCB that wicks over the edge onto a plated edge surface of the PCB. The edge shield is then soldered to the plated edge surface. However, the solder overprint occupies space on the PCB that would otherwise be available for mounting electronic components. Mechanisms to reduce the overall footprint of shield cans, and specifically edge shields, would be helpful to maximize usage of PCB space and minimize overall PCB size.

SUMMARY

Implementations described and claimed herein address the foregoing problems by providing a printed circuit board comprising a substrate with a plated edge surface, a shield wall, and a shield lid mechanically engaged and in conductive contact with the plated edge surface and in conductive contact with the shield wall. The plated edge surface and the shield wall form a continuous conductive loop.

Implementations described and claimed herein address the foregoing problems by further providing a method of assembling a printed circuit board comprising plating at least one edge surface of a substrate, placing a shield wall onto the substrate, and securing a shield lid onto the substrate mechanically engaged and in conductive contact with the plated edge surface and in conductive contact with the shield wall. The plated edge surface and the shield wall form a continuous conductive loop.

Implementations described and claimed herein address the foregoing problems by still further providing a printed circuit board comprising a substrate with a plated edge surface, a shielded electronic component placed on the substrate, and a shield wall. The plated edge surface and the shield wall form a continuous conductive loop about the shielded electronic component. The printed circuit board further comprises a shield lid mechanically engaged and in conductive contact with the plated edge surface and soldered to the shield wall. The substrate, the shield wall, and the shield lid in combination envelop the shielded electronic component.

Other implementations are also described and recited herein. This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTIONS OF THE DRAWINGS

DETAILED DESCRIPTION

The presently disclosed technology utilizes a plated edge surface of a PCB to form one or more sides of an electronic shield to reduce the amount of top surface area of the PCB occupied by the electronic shield. Further, conventional shield attachments often obscure some aspects of the electronic components contained therein. The mechanically attached edge shields described in detail herein may aid in inspection (e.g., via an automated optical inspection (AOI) machine) of the one or more electronic components.

Figure 1:
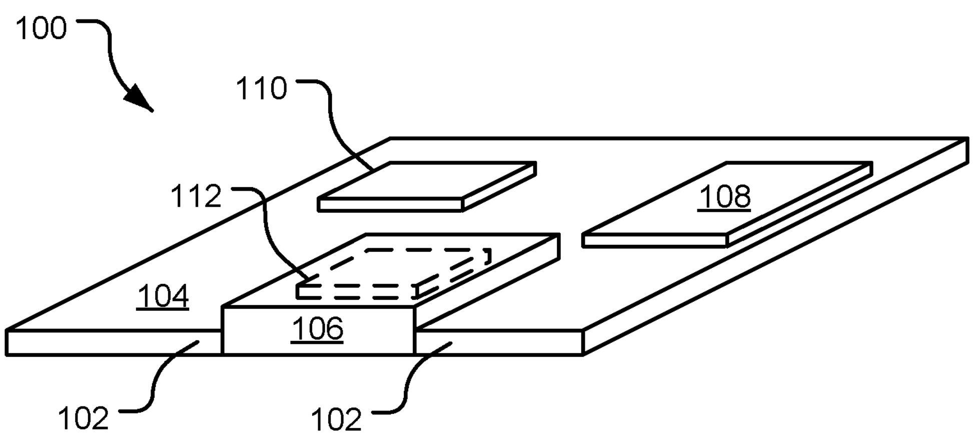
FIG. 1 illustrates an example PCB incorporating an edge shield mechanically attached to a plated edge surface of a substrate.

FIG. 1 illustrates a PCB 100 incorporating an edge shield 106 mechanically attached to a plated edge surface 102 of a substrate 104. The substrate 104 may be any insulating or dielectric substrate (e.g., a woven fiberglass cloth with an epoxy resin binder) with a network of conductive paths (e.g., vias and traces) and other conductive areas (e.g., the plated edge surface 102) thereon. In various implementations, the substrate 104 may include ceramics, fiberglass, plastics (e.g., flexible polymers), or any combination thereof. The plated edge surface 102 and the other conductive paths and areas may be of a similar or dissimilar metallic materials (e.g., copper, nickel, silver, tin, gold, and alloys thereof).

A variety of electronic components (e.g., electronic components 108, 110, 112) are soldered to the network of conductive paths on the substrate 104 to create a functional electrical network. In various implementations, the electronic components 108, 110, 112 and other electronic components (not shown) may be capacitors, resistors, microprocessors, and storage devices, for example. Electronic component 112 is shown in dashed lines to illustrate that it is enclosed or enveloped by the edge shield 106 and the substrate 104 and thus hidden from view. The PCB 100 may be single-sided (e.g., having one conductive layer, as shown in FIG. 1), double-sided (e.g., having two conductive layers) or multi-layer (e.g., having outer and inner conductive layers). Various implementations described herein may be implemented on single-sided, double-sided, or multi-layered PCBs.

In combination with the substrate 104, the edge shield 106 encompasses or envelops one or more electronic components (e.g., the electronic component 112) that are sensitive to electronic interference generated by nearby electronic components (e.g., the electronic components 108, 110) or other nearby electronic devices. The edge shield 106 may be operated as a faraday cage to shield the electronic components therein from external electronic fields (e.g., radio frequency and electromagnetic interference). In other implementations, the edge shield 106 shields the external electronic components (e.g., the electronic components 108, 110) from electronic fields generated by the electronic components therein (e.g., the electronic component 112). In other words, the edge shield 106 functions as a barrier to various electronic fields originating inside or outside of the edge shield 106.

Figure 4:
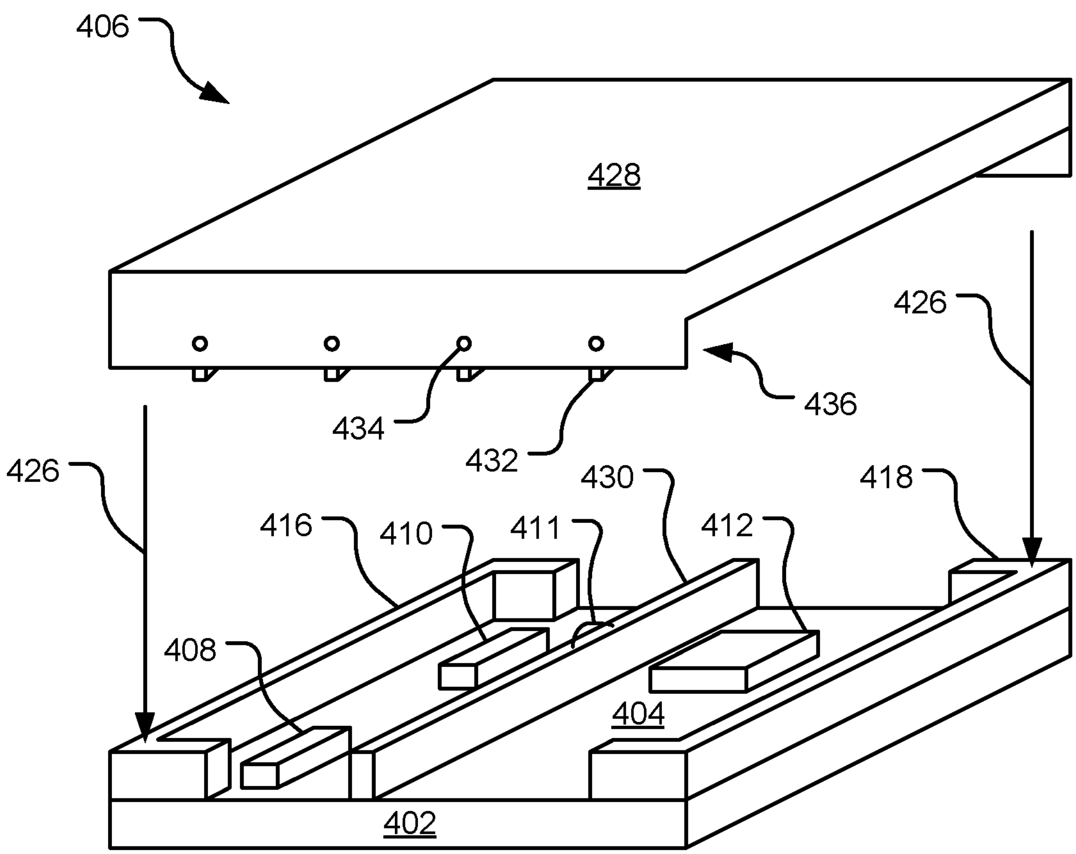
FIG. 4 illustrates an example edge shield incorporating a shield lid to be attached to shield walls.
Figure 5:
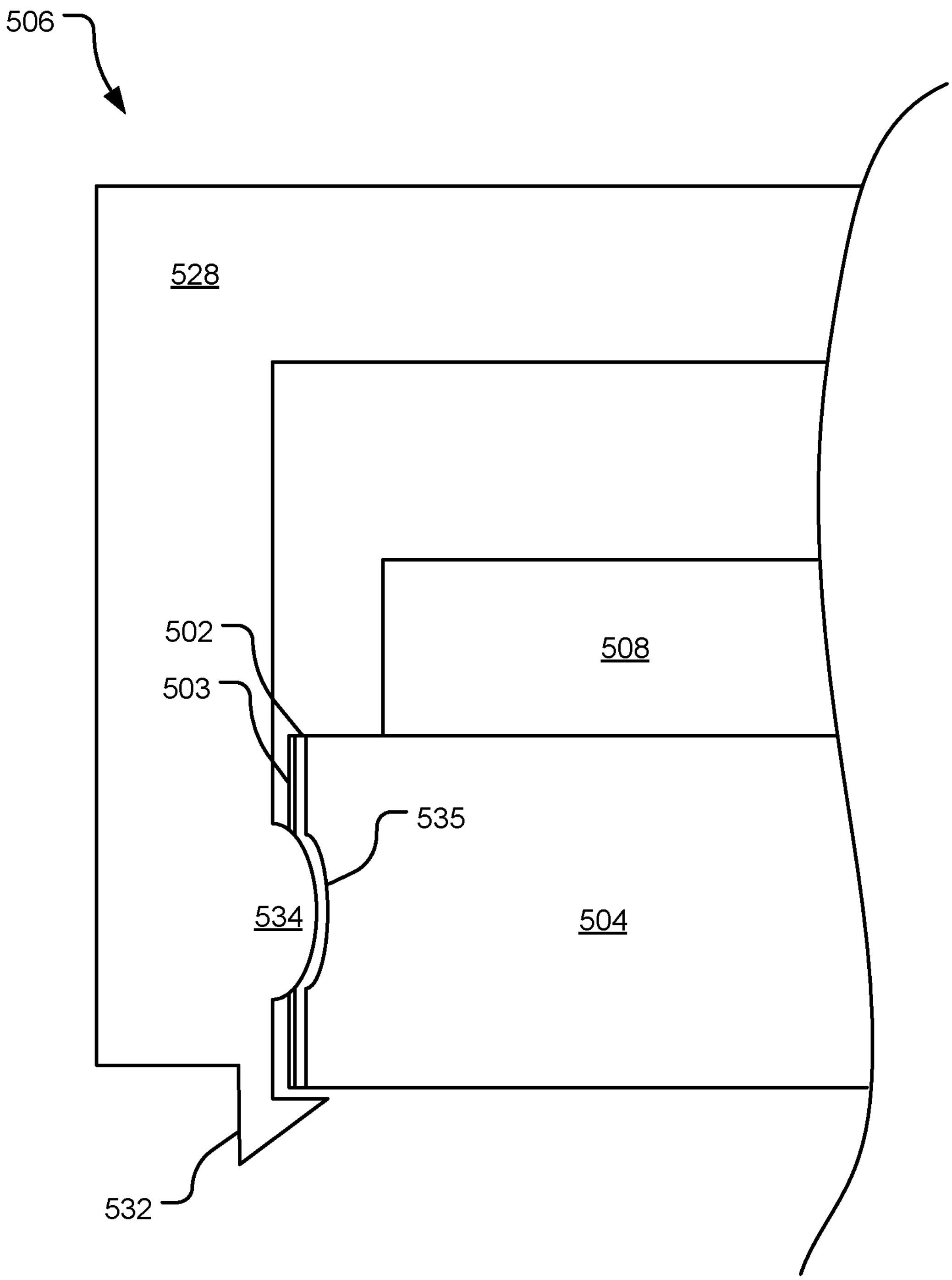
FIG. 5 illustrates a sectional side view of an example edge shield having a shield lid mechanically attached to a plated edge surface of a substrate.
Figure 6:
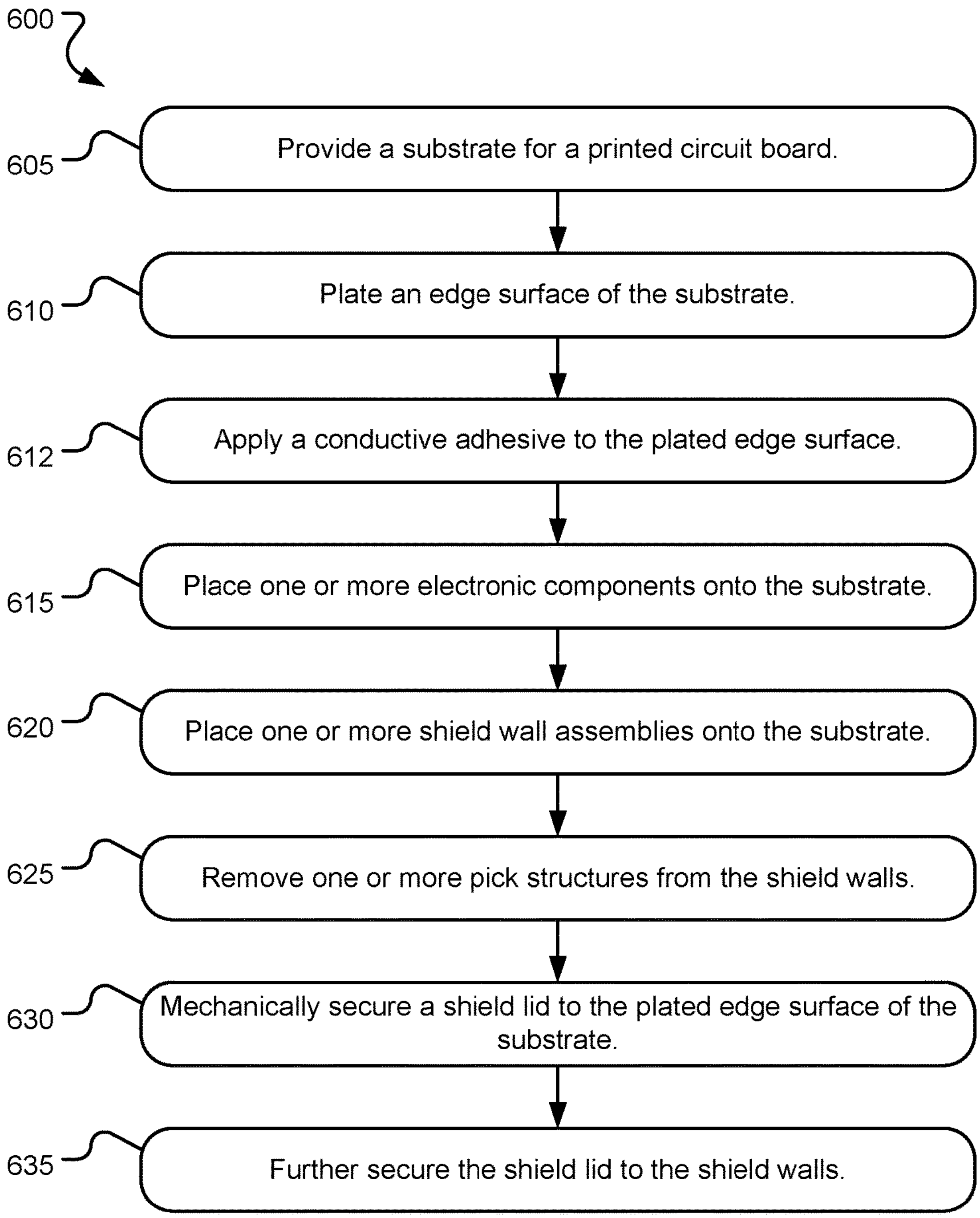
FIG. 6 illustrates example operations for assembling a printed circuit board with a mechanically attached edge shield.

The edge shield 106 is mechanically attached to the plated edge surface 102 of the substrate 104 via one or more protruding attachment features (not shown, see e.g., clips 432, 532 and dimples 434, 534, 535 of FIGS. 5 and 6). The edge shield 106 is further attached to sides of shield walls (not shown, see e.g., shield walls 416, 418 of FIG. 4) forming the remainder of a continuous conductive loop about the electronic component 112. In other words, the continuous conductive loop encompasses all electronic components contained therein. The edge shield 106 may take any convenient shape to accommodate the electronic components contained therein. For example, the edge shield 106 is rectangular, but in other implementations, the edge shield may have any closed profile that incorporates a plated edge surface as part of the continuous conductive loop about the electronic components contained therein.

In various implementations, the edge shield 106 frees up an approximately 1-3 mm wide strip of space for placement or arrangement of electronic components on top and/or bottom surfaces of the substrate 104 adjacent the plated edge surface 102 that would otherwise be occupied by a shield track (or flange) or a solder overprint.

Figure 2:
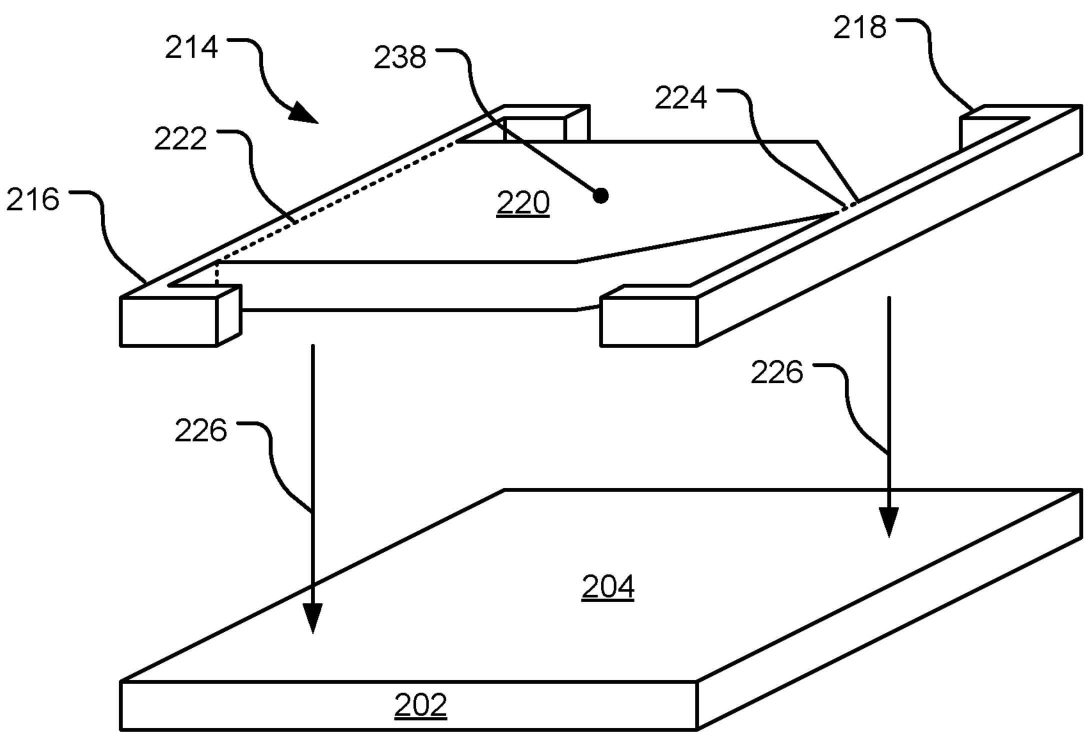
FIG. 2 illustrates an example shield wall assembly to be attached adjacent a plated edge surface of a substrate.

FIG. 2 illustrates an example shield wall assembly 214 to be attached adjacent a plated edge surface 202 of a substrate 204. The substrate 204 may be any insulating or dielectric substrate with a network of conductive paths and other conductive areas (e.g., the plated edge surface 202) thereon. The plated edge surface 202 and other conductive paths and areas may be of similar or dissimilar metallic materials. The shield wall assembly 214 is placed onto the substrate 204, as illustrated by arrows 226.

The shield wall assembly 214 includes two shield wall sections 216, 218 temporarily connected by a pick structure 220. The pick structure 220 serves as a handle for manipulating the shield wall sections 216, 218 using a pick-and-place machine, while maintaining a desired spacing and orientation between the shield wall sections 216, 218. The pick structure 220 may include a specific pick point 238 to aid alignment on the substrate 204 using the pick-and-place machine. In other implementations, the pick structure 220 may have a different shape and/or thickness than that shown, and may include stiffening features as needed. Dotted lines 222, 224 indicate weakened areas between the shield wall sections 216, 218 and the pick structure 220 where the pick structure 220 is intended to be broken or cut away from the shield wall sections 216, 218 after the shield wall assembly 214 is placed on the substrate 204. In other implementations, the pick structure 220 is not removed and remains in a final PCB product.

In various implementations, the weakened areas are perforations or divots in the shield wall assembly 214, or an area of decreased overall thickness of the shield wall assembly 214. In one implementation, the shield wall assembly 214 is cut or snipped at dotted line 224 and the pick structure 220 is pivoted upward about dotted line 222 to weaken and subsequently break the pick structure 220 away from the shield wall section 216. In other implementations, the dotted lines 222, 224 merely illustrate where the pick structure 220 is to be broken or cut away with no specific weakness in that area of the shield wall assembly 214.

The substrate 204 is shown with a similar size and shape as the shield wall assembly 214 for convenience only. For example, substrate 104 of FIG. 1 shares a single edge surface 102 with edge shield 106 of FIG. 1 and has a substantially different size than the edge shield 106.

Figure 3:
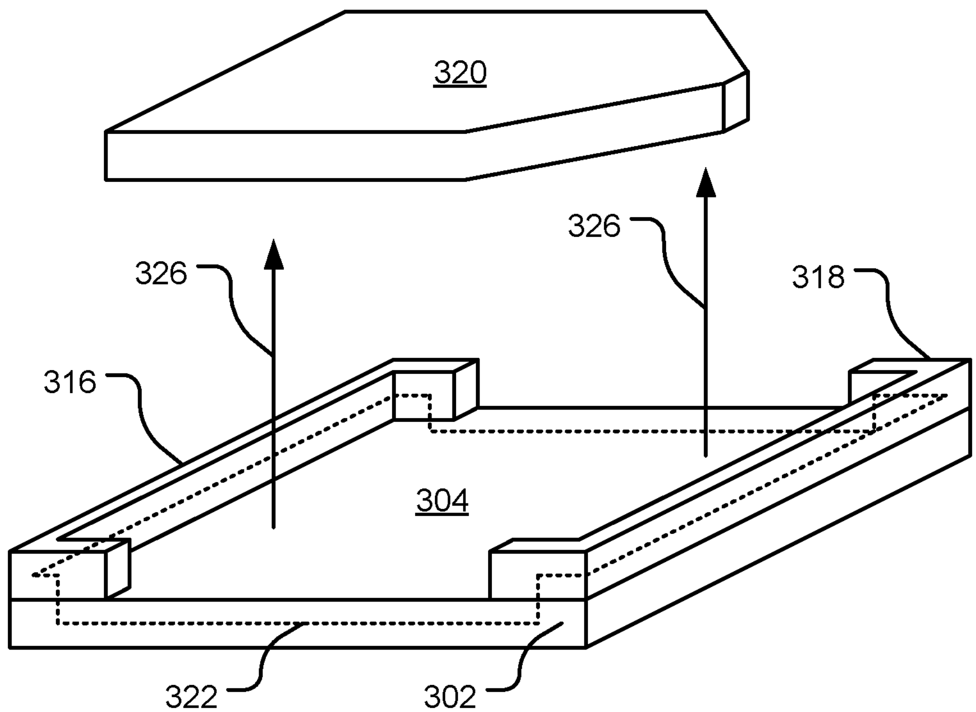
FIG. 3 illustrates example shield walls attached adjacent a plated edge surface of a substrate with a pick structure removed.

FIG. 3 illustrates example shield walls 316, 318 attached adjacent a plated edge surface 302 of a substrate 304 with a pick structure 320 removed. The substrate 304 may be any insulating or dielectric substrate with a network of conductive paths and other conductive areas (e.g., the plated edge surface 302) thereon. The plated edge surface 302 and other conductive paths and areas may be of similar or dissimilar metallic materials.

Two u-shaped shield wall sections 316, 318 are placed onto and attached to the substrate 304. The shield wall sections 316, 318 are placed in a manner that forms a continuous conductive loop 322, illustrated by dotted lines about a perimeter of a completed edge shield (not shown, see e.g., edge shield 406 of FIG. 4). More specifically, the continuous conductive loop 322 travels through the plated edge surface 302, upward and through the shield wall section 316, downward and through another plated edge surface opposite the plated edge surface 302 (not shown), upward and through the shield wall section 318, and returning downward to the plated edge surface 302. In other words, the continuous conductive loop 322 encompasses electronic components later contained therein. In various implementations, the shield wall sections 316, 318 are soldered, welded, adhered, or mechanically attached to the substrate 304.

The relative size and shape of the plated edge surface 302 and the shield wall sections 316, 318 is arbitrary so long as it is sufficient to encompass any intended electronic components and forms a continuous conductive loop. For example, the shield wall sections may be straight or L-shaped. For further example, there may be greater or fewer plated edge surfaces and shield wall sections in other implementations. In still further implementations, the shield wall sections may take the form of a series of legs, posts, or castellations in addition to or in place of the shield walls 316, 318.

The pick structure 320, which was utilized to place the shield walls 316, 318 onto the substrate 304, is now separated from the shield walls 316, 318 (e.g., via breaking or cutting) and lifted away, as illustrated by arrows 326. The pick structure 320 may subsequently be discarded.

FIG. 4 illustrates an example edge shield 406 incorporating a shield lid 428 to be attached to shield walls 416, 418. A substrate 404 may be any insulating or dielectric substrate with a network of conductive paths and other conductive areas (e.g., plated edge surface 402) thereon. The plated edge surface 402 and other conductive paths and areas may be of similar or dissimilar metallic materials. A variety of electronic components (e.g., electronic components 408, 410, 412) are soldered to the network of conductive paths on the substrate 404 to create a functional electrical network.

The shield wall sections 416, 418 are placed in a manner that forms a continuous conductive loop (not shown, see e.g., continuous conductive loop 322 of FIG. 3) in combination with the plated edge surface 402 about a perimeter of the edge shield 406 and are attached to the substrate 404.

The shield wall sections 416, 418 also are arranged around the electronic components 408, 410, 412 to shield the electronic components 408, 410, 412 from external electronic fields, or to shield external electronic components (not shown) from electronic fields generated by the electronic components 408, 410, 412. In other words, the continuous conductive loop encompasses and may shield the components 408, 410, 412 contained therein.

In some implementations, internal shield wall 430 shields one or more electronic components within the edge shield 406 from another one or more electronic components within the edge shield 406. Here, electronic components 408, 410 are shielded from electronic component 412, or vice versa. The internal shield wall 430 in combination with the shield wall sections 416, 418 forms two conductive sub-loops. A first sub-loop travels through the plated edge surface 402, upward and through the shield wall section 416, downward and through another plated edge surface opposite the plated edge surface 402 (not shown), upward and through the internal shield wall 430, and returning downward to the plated edge surface 402. A second sub-loop travels through the plated edge surface 402, upward and through the shield wall section 418, downward and through another plated edge surface opposite the plated edge surface 402 (not shown), upward and through the internal shield wall 430, and returning downward to the plated edge surface 402.

In various implementations, the internal shield wall 430 utilizes the same or a different pick structure (not shown, see e.g., pick structure 220, 320 of FIGS. 2 and 3) than that utilized by the shield wall sections 416, 418. The internal shield wall 430 may also be soldered, welded, adhered, or mechanically attached to the substrate 404. In other implementations, the internal shield wall 430 is omitted.

The shield lid 428 is placed onto the substrate 404 and attached to the substrate 404 and the shield wall sections 416, 418, as illustrated by arrows 426. Portions of the shield lid 428 placed adjacent the shield wall sections 416, 418 are soldered, welded, adhered, or mechanically attached to the shield wall sections 416, 418. Portions of the shield lid 428 placed adjacent the internal shield wall 430 may be soldered, welded, adhered, or mechanically attached to the internal shield wall 430, and/or held in compressive contact with the internal shield wall 430 via one or more mechanical springs (see e.g., spring 411). Portions of the shield lid 428 placed adjacent the plated edge surface 402 have an area of increased depth 436 and are mechanically attached to the plated edge surface 402 and secured via one or more attachment features (e.g., dimples, snaps, clasps, clips, buttons, and spring fingers). In combination with the substrate 404, the edge shield 406 encompasses or envelops the electronic components 408, 410, 412.

The attachment features may perform one or both of two functions. The first function is to hold the shield lid 428 securely in place on the substrate 404 once the shield lid 428 is attached to the substrate 404. For example, clips (e.g., clip 432) snap over a bottom surface of the substrate 404 to hold the shield lid 428 in place on the substrate 404. In some implementations, the attachment features must be sufficient to hold the shield lid 428 securely in place even when a computing device incorporating the shield lid 428 is subjected to a drop or impact. The second function is to aid a conductive or electrical connection between the shield lid 428 and the substrate 404 via the plated edge surface 402. For example, protruding dimples (e.g., dimple 434) press into the plated edge surface 402 and may form or engage with preexisting matching recessed dimples (not shown, see e.g., dimple 535 of FIG. 5) in the plated edge surface 402 to enhance conductive contact between the shield lid 428 and the plated edge surface 402. Further, in various implementations, the shield lid 428 is slip-fit, interference fit, or press-fit onto the shield wall sections 416, 418 and the substrate 404.

FIG. 5 illustrates a sectional side view of an example edge shield 506 having a shield lid 528 mechanically attached to a plated edge surface 502 of a substrate 504. The substrate 504 may be any insulating or dielectric substrate with a network of conductive paths and other conductive areas (e.g., plated edge surface 502) thereon. The plated edge surface 502 and other conductive paths and areas may be of similar or dissimilar metallic materials. A variety of electronic components (e.g., electronic component 508) are soldered to the network of conductive paths on the substrate 504 to create a functional electrical network.

The shield lid 528 is placed onto the substrate 504 and attached to the substrate 504 and shield wall sections (not shown). The depicted portion of the shield lid 528 placed adjacent the plated edge surface 502 is mechanically attached to the plated edge surface 502 and secured via one or more attachment features (e.g., dimples, snaps, clasps, clips, buttons, spring fingers, and a conductive adhesive).

The attachment features may perform one or both of two functions. The first function is to hold the shield lid 528 in place on the substrate 504 once the shield lid 528 is attached to the substrate 504. For example, clip 532 snaps over a bottom surface of the substrate 504 to hold the shield lid 528 in place on the substrate 504. The second function is to aid a conductive connection between the shield lid 528 and the substrate 504 via the plated edge surface 502. For example, protruding dimple 534 presses into the plated edge surface 502 and may form or engage with a preexisting matching recessed dimple 535 in the plated edge surface 502 to establish or enhance electrically conductive contact between the shield lid 528 and the plated edge surface 502. In other implementations, the clip 532 performs both functions and the protruding dimple 534 is omitted, or vice versa. In some implementations, a conductive adhesive layer 503 adheres the shield lid 528 to the plated edge surface 502. The conductive adhesive layer may take the form of an adhesive tape or paste impregnated with metallic powder or shavings (e.g., anisotropic conductive film). The conductive adhesive layer 503 may be used in addition to or in lieu of clips and/or dimples. In various implementations, heat and/or pressure are applied to the shield lid 528 and the substrate 504 to adhere the shield lid 528 to the plated edge surface 502.

The substrate 504 and the shield lid 528 may each have a variety of sizes and shapes, as well as other dimensions. Further, an intended size and shape of the substrate 504 and the shield lid 528 may vary based on manufacturing tolerances of the substrate 504 and the shield lid 528. As a result, the attachment features have an operating range that encompasses the applicable tolerances for the substrate 504 and the shield lid 528, which permits the attachment features to consistently hold the shield lid 528 in place on the substrate 504 and consistently aid a conductive connection between the shield lid 528 and the substrate 504 via the plated edge surface 502.

FIG. 6 illustrates example operations 600 for assembling a printed circuit board with a mechanically attached edge shield. A providing operation 605 provides a substrate for the printed circuit board. The substrate may be any insulating or dielectric substrate with a network of conductive paths and other conductive areas (e.g., a plated edge surface) thereon.

A plating operation 610 plates the edge surface of the substrate with a metal or metallic alloy. The plated edge surface is located along an exterior edge of the substrate where the edge shield will utilize the edge plating as a component of the edge shield. The plating operation 610 is referred to herein as edge plating or side plating. In various implementations, the plating operation 610 may be performed concurrently with other operations that create the network of conductive paths and other conductive areas on the substrate. The plating operation 610 may also be a hole plating operation. More specifically, a series of holes or divots are drilled along the exterior edge of the substrate where the edge shield will utilize the edge plating as a component of the edge shield. The holes or divots are then plated. First shield securing operation 630 described in detail below may specifically mechanically engage with the plated holes or divots along the exterior edge of the substrate.

An application operation 612 applies a conductive adhesive to the plated edge surface. The conductive adhesive may be an acrylic or epoxy adhesive, in tape or paste form, which is impregnated with conductive particles. The conductive particles are capable of forming an electrical path through the conductive adhesive to the plated edge surface. Heat and/or pressure may be applied to the conductive adhesive to adhere it to the plated edge surface (also referred to as a "pre-tack").

A placing operation 615 places one or more electronic components onto the substrate. The electronic components are soldered to the network of conductive paths on the substrate to create a functional electrical network. In various implementations, the electronic components may be capacitors, resistors, microprocessors, and storage devices, for example. The electronic components are placed on the substrate in a manner that at least one of the electronic components is located within the continuous conductive loop formed by shield walls (see placing operation 615 below) and the plated edge surface. In other words, the continuous conductive loop encompasses the electronic component(s) contained therein. When complete, the edge shield will shield the enclosed or enveloped electronic component(s) from external electronic fields or shield one or more external electronic components from electronic fields generated by the enclosed or enveloped electronic component(s).

A placing operation 620 places one or more shield wall assemblies onto the substrate. In various implementations, each shield wall assembly includes at least one shield wall and an attached pick structure. Pick-and-place equipment utilizes the pick structure(s) to physically place each associated shield wall assembly in an intended location and orientation on the substrate. The shield wall(s) are then soldered or otherwise attached to the substrate concurrently with the placing operation 620 or in an additional step. In some implementations, a first shield wall assembly includes one or more exterior shield walls and a second shield wall assembly includes one or more interior shield walls. In implementations where a shield wall assembly contains more than one discrete shield wall, the pick structure maintains a desired spacing and orientation between the multiple shield walls prior to attachment to the substrate. The shield wall(s) are placed in a manner that forms a continuous conductive loop in combination with the plated edge surface about a perimeter of the edge shield.

A removing operation 625 removes the pick structure(s) from the shield wall(s). Once the shield walls are attached to the substrate, the removing operation 620 removes the pick structure(s) from the shield wall(s) by cutting and/or breaking them away. The pick structure(s) may then be discarded and the shield wall(s) remain attached to the substrate.

A first shield securing operation 630 mechanically secures a shield lid to the plated edge surface of the substrate. The shield lid is a metal or metal alloy structure that has a perimeter shape that matches a perimeter formed by the shield walls and the plated edge surface. The shield lid further has side portions that extend down to attach to the shield walls and the plated edge surface. Portions of the shield lid placed adjacent the plated edge surface have an area of increased depth that extends down and are mechanically attached to the plated edge surface and secured via one or more mechanical attachment features (e.g., dimples, snaps, clasps, clips, buttons, spring fingers, and conductive adhesive).

A second shield securing operation 635 further secures the shield lid to the shield wall(s) of the substrate. Portions of the shield lid placed adjacent the shield wall(s) are soldered, welded, adhered, and/or mechanically attached to the shield wall(s). In some implementations, the securing operations 630, 635 are reversible, which renders the shield lid selectively removable from the substrate and the shield walls.

The logical operations making up the embodiments of the invention described herein are referred to variously as operations, steps, objects, or modules. Furthermore, the logical operations may be performed in any order, adding or omitting operations as desired, unless explicitly claimed otherwise or a specific order is inherently necessitated by the claim language.

An example printed circuit board according to the presently disclosed technology includes a substrate with a plated edge surface, a shield wall placed on the substrate, and a shield lid mechanically engaged and in conductive contact with the plated edge surface and in conductive contact with the shield wall. The plated edge surface and the shield wall form a continuous conductive loop.

Another example printed circuit board according to the presently disclosed technology further includes a shielded electronic component, wherein the continuous conductive loop encompasses the shielded electronic component.

In another example printed circuit board according to the presently disclosed technology, the substrate, the shield wall, and the shield lid in combination envelop the shielded electronic component and shield the shielded electronic component from external electronic interference.

Another example printed circuit board according to the presently disclosed technology further includes an external electronic component, wherein the substrate, the shield wall, and the shield lid in combination provides an electronic field barrier between the external electronic component and the shielded electronic component.

In another example printed circuit board according to the presently disclosed technology, the shield lid includes a protruding attachment feature that mechanically engages with the plated edge surface of the substrate.

In another example printed circuit board according to the presently disclosed technology, the protruding attachment feature includes one or more of dimples, snaps, clasps, clips, buttons, and spring fingers.

Another example printed circuit board according to the presently disclosed technology further includes a conductive adhesive that adheres the shield lid to the plated edge surface of the substrate.

In another example printed circuit board according to the presently disclosed technology, the plated edge surface, the shield wall, and the shield lid are each metallic structures.

In another example printed circuit board according to the presently disclosed technology, the shield lid is one or both of soldered to the shield wall and mechanically attached to the shield wall.

In another example printed circuit board according to the presently disclosed technology, the shield lid includes an area of increased depth adjacent the plated edge surface.

In another example printed circuit board according to the presently disclosed technology, the shield wall includes two or more discrete wall sections.

Another example printed circuit board according to the presently disclosed technology further includes an internal shield wall subdividing the continuous conductive loop into two or more conductive sub-loops.

An example method of assembling a printed circuit board according to the presently disclosed technology includes plating at least one edge surface of a substrate, placing a shield wall onto the substrate, and securing a shield lid onto the substrate mechanically engaged and in conductive contact with the plated edge surface and in conductive contact with the shield wall. The plated edge surface and the shield wall form a continuous conductive loop.

Another example method of assembling a printed circuit board according to the presently disclosed technology further includes placing a shielded electronic component onto the substrate. The continuous conductive loop encompasses the shielded electronic component.

In another example method of assembling a printed circuit board according to the presently disclosed technology, placing the shield wall includes placing a shield wall assembly onto the substrate, soldering a discrete wall section of the shield wall assembly to the substrate, and removing a pick structure from the shield wall assembly.

In another example method of assembling a printed circuit board according to the presently disclosed technology, placing the shield wall includes placing an external shield wall onto the substrate and placing an internal shield wall onto the substrate. The plated edge surface and the external shield wall forms the continuous conductive loop. The internal shield wall subdivides the continuous conductive loop into two or more conductive sub-loops.

Another example method of assembling a printed circuit board according to the presently disclosed technology further includes soldering the shield lid to the shield wall.

Another example method of assembling a printed circuit board according to the presently disclosed technology further includes mechanically attaching the shield lid to the shield wall.

Another example printed circuit board according to the presently disclosed technology includes a substrate with a plated edge surface, a shielded electronic component placed on the substrate, a shield wall placed on the substrate, and a shield lid mechanically engaged and in conductive contact with the plated edge surface. The plated edge surface and the shield wall form a continuous conductive loop about the shielded electronic component. The shield lid is further attached to and in conductive contact with the shield wall and the substrate, the shield wall, and the shield lid in combination envelop the shielded electronic component.

In another example printed circuit board according to the presently disclosed technology, the shield lid includes a protruding attachment feature that mechanically engages with the plated edge surface of the substrate.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A printed circuit board comprising:

a substrate with a plated edge surface, the substrate including a top surface and a bottom surface, the plated edge surface extending between the top surface and the bottom surface;

a shield wall placed on the substrate, wherein a combination of the plated edge surface and the shield wall form a continuous conductive loop; and a shield lid mechanically engaged and in conductive contact with the plated edge surface and in conductive contact with the shield wall.

2. The printed circuit board of claim 1, further comprising:

a shielded electronic component, wherein the continuous conductive loop encompasses the shielded electronic component.

3. The printed circuit board of claim 2, wherein the substrate, the shield wall, and the shield lid in combination envelop the shielded electronic component and shield the shielded electronic component from external electronic interference.

4. The printed circuit board of claim 2, further comprising:

an external electronic component, wherein the substrate, the shield wall, and the shield lid in combination provides an electronic field barrier between the external electronic component and the shielded electronic component.

5. The printed circuit board of claim 1, wherein the shield lid includes a protruding attachment feature that mechanically engages with the plated edge surface of the substrate.

6. The printed circuit board of claim 5, wherein the protruding attachment feature includes one or more of dimples, snaps, clasps, clips, buttons, and spring fingers.

7. The printed circuit board of claim 1, further comprising:

a conductive adhesive that adheres the shield lid to the plated edge surface of the substrate.

8. The printed circuit board of claim 1, wherein the plated edge surface, the shield wall, and the shield lid are each metallic structures.

9. The printed circuit board of claim 1, wherein the shield lid is one or both of soldered to the shield wall and mechanically attached to the shield wall.

10. The printed circuit board of claim 1, wherein the shield lid includes an area of increased depth adjacent the plated edge surface.

11. The printed circuit board of claim 1, wherein the shield wall includes two or more discrete wall sections.

12. The printed circuit board of claim 1, further comprising:

an internal shield wall subdividing the continuous conductive loop into two or more conductive sub-loops.

13. A method of assembling a printed circuit board comprising:

plating at least one edge surface of a substrate, the edge surface extending between a top surface of the substrate and a bottom surface of the substrate;

placing a shield wall onto the substrate, wherein a combination of the plated edge surface and the shield wall form a continuous conductive loop; and securing a shield lid onto the substrate mechanically engaged and in conductive contact with the plated edge surface and in conductive contact with the shield wall.

14. The method of claim 13, further comprising:

placing a shielded electronic component onto the substrate, wherein the continuous conductive loop encompasses the shielded electronic component.

15. The method of claim 13, wherein placing the shield wall includes:

placing a shield wall assembly onto the substrate;

soldering a discrete wall section of the shield wall assembly to the substrate; and removing a pick structure from the shield wall assembly.

16. The method of claim 13, wherein placing the shield wall includes:

placing an external shield wall onto the substrate, wherein the plated edge surface and the external shield wall forms the continuous conductive loop; and placing an internal shield wall onto the substrate, wherein the internal shield wall subdivides the continuous conductive loop into two or more conductive sub-loops.

17. The method of claim 13, further comprising:

soldering the shield lid to the shield wall.

18. The method of claim 13, further comprising:

mechanically attaching the shield lid to the shield wall.

19. A printed circuit board comprising:

a substrate with a plated edge surface, the substrate including a top surface and a bottom surface, the plated edge surface extending between the top surface and the bottom surface;

a shielded electronic component placed on the substrate;

a shield wall placed on the substrate, wherein a combination of the plated edge surface and the shield wall form a continuous conductive loop about the shielded electronic component; and a shield lid mechanically engaged and in conductive contact with the plated edge surface, the shield lid further attached to and in conductive contact with the shield wall, wherein the substrate, the shield wall, and the shield lid in combination envelop the shielded electronic component.

20. The printed circuit board of claim 19, wherein the shield lid includes a protruding attachment feature that mechanically engages with the plated edge surface of the substrate.

* * * * *